(12) United States Patent
Matsuyama

(10) Patent No.: US 6,287,025 B1
(45) Date of Patent: Sep. 11, 2001

(54) SUBSTRATE PROCESSING APPARATUS

(75) Inventor: Yuji Matsuyama, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/373,567

(22) Filed: Aug. 13, 1999

(30) Foreign Application Priority Data

Aug. 14, 1998 (JP) ........................................................ 244422

(51) Int. Cl.[7] ................................. G03D 5/00; B05C 5/00
(52) U.S. Cl. ........................ 396/611; 396/571; 396/579; 118/66; 118/69; 414/935; 414/937; 414/941
(58) Field of Search ..................................... 396/611, 571, 396/577; 414/935, 937, 938, 940, 941; 355/27, 30; 118/52, 58, 66, 69

(56) References Cited

U.S. PATENT DOCUMENTS

| 5,639,301 | * | 6/1997 | Sasada et al. | 414/935 |
| 5,972,110 | * | 10/1999 | Akimoto | 414/935 |
| 6,024,502 | * | 2/2000 | Akimoto et al. | 396/611 |

FOREIGN PATENT DOCUMENTS 10-135307    5/1998   (JP).

* cited by examiner

*Primary Examiner*—Alan A. Mathews
(74) *Attorney, Agent, or Firm*—Rader, Fishman & Grauer

(57) ABSTRACT

A resist coating block is composed of a resist coating unit, a cooling unit group, and a first sub-conveying unit that conveys a wafer W between the resist coating unit and the cooling unit group. A developing block is composed of a developing unit, a cooling unit group, and a second sub-conveying unit that conveys a wafer W between the developing unit and the cooling unit group. Heat insulating panels are disposed to the blocks opposite to heating units. A first main-conveying unit and a second main-conveying unit are disposed between the blocks. The first main conveying unit is disposed between a first heat treatment block and a third heat treatment block. The second main conveying unit is disposed between a second heat treatment block and a fourth heat treatment block. Thus, variation of the film thickness of a resist film coated on a wafer W can be prevented against heat radiated by the heating units.

20 Claims, 9 Drawing Sheets

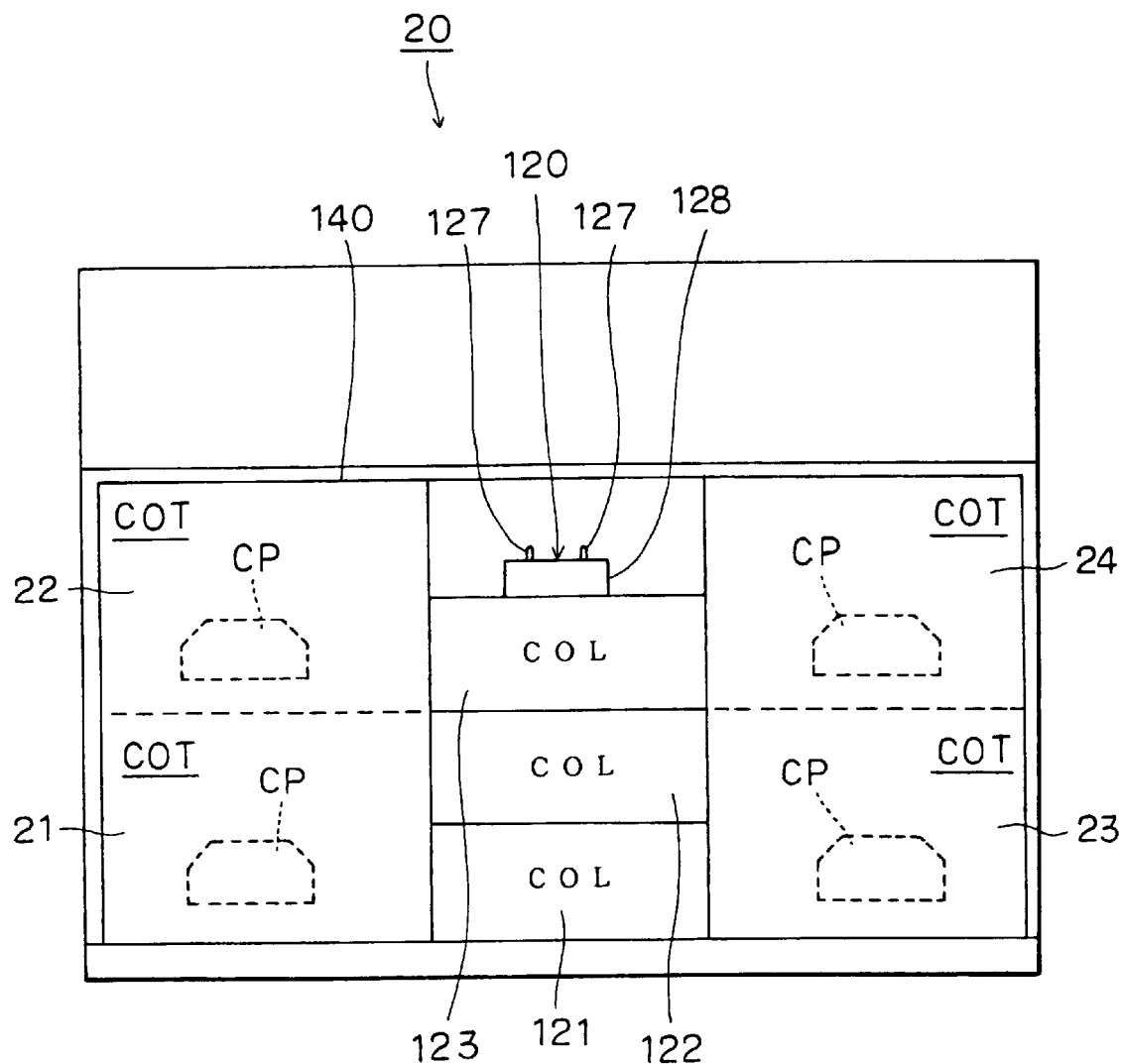
F I G. 7

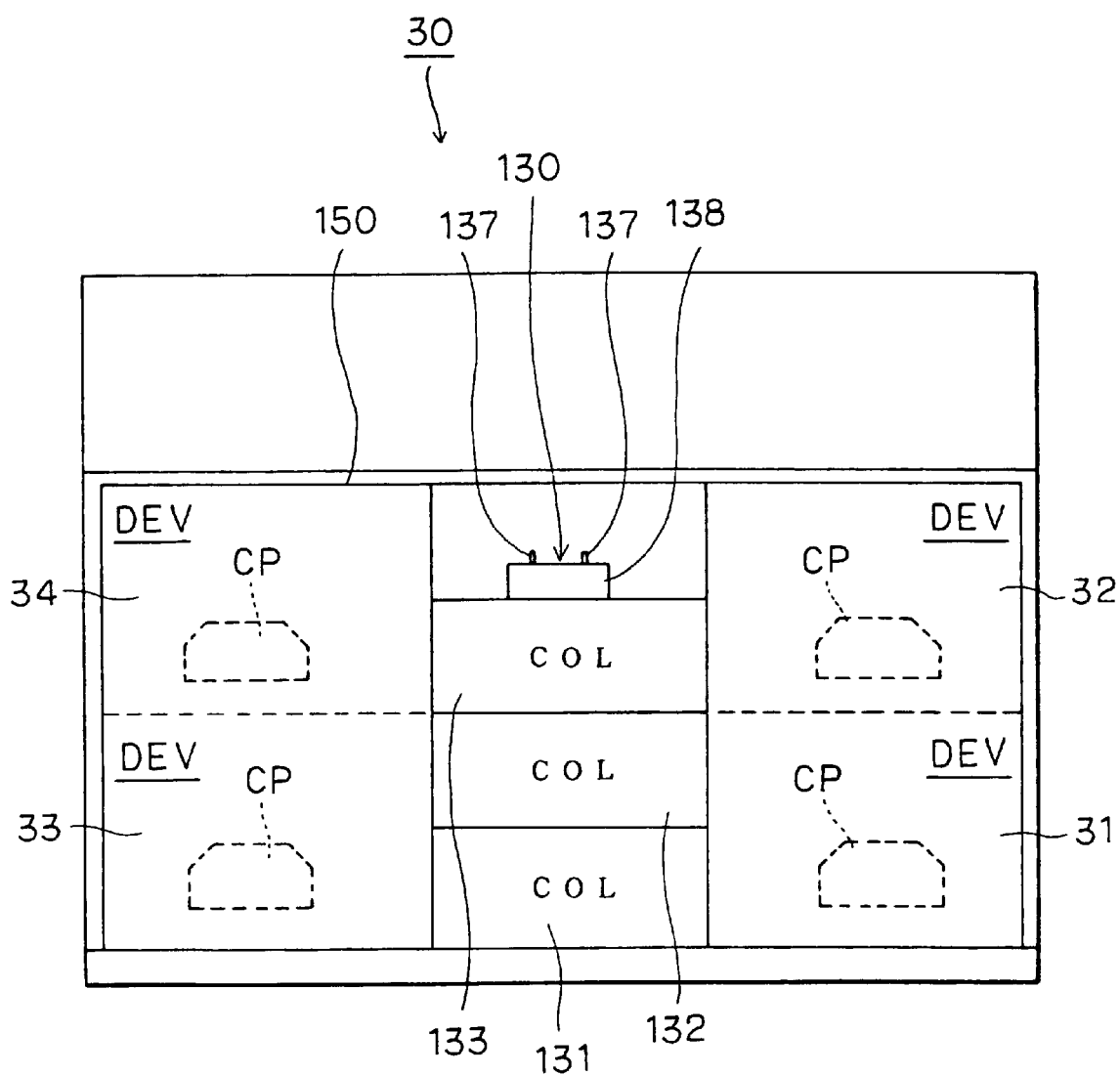
F I G. 8

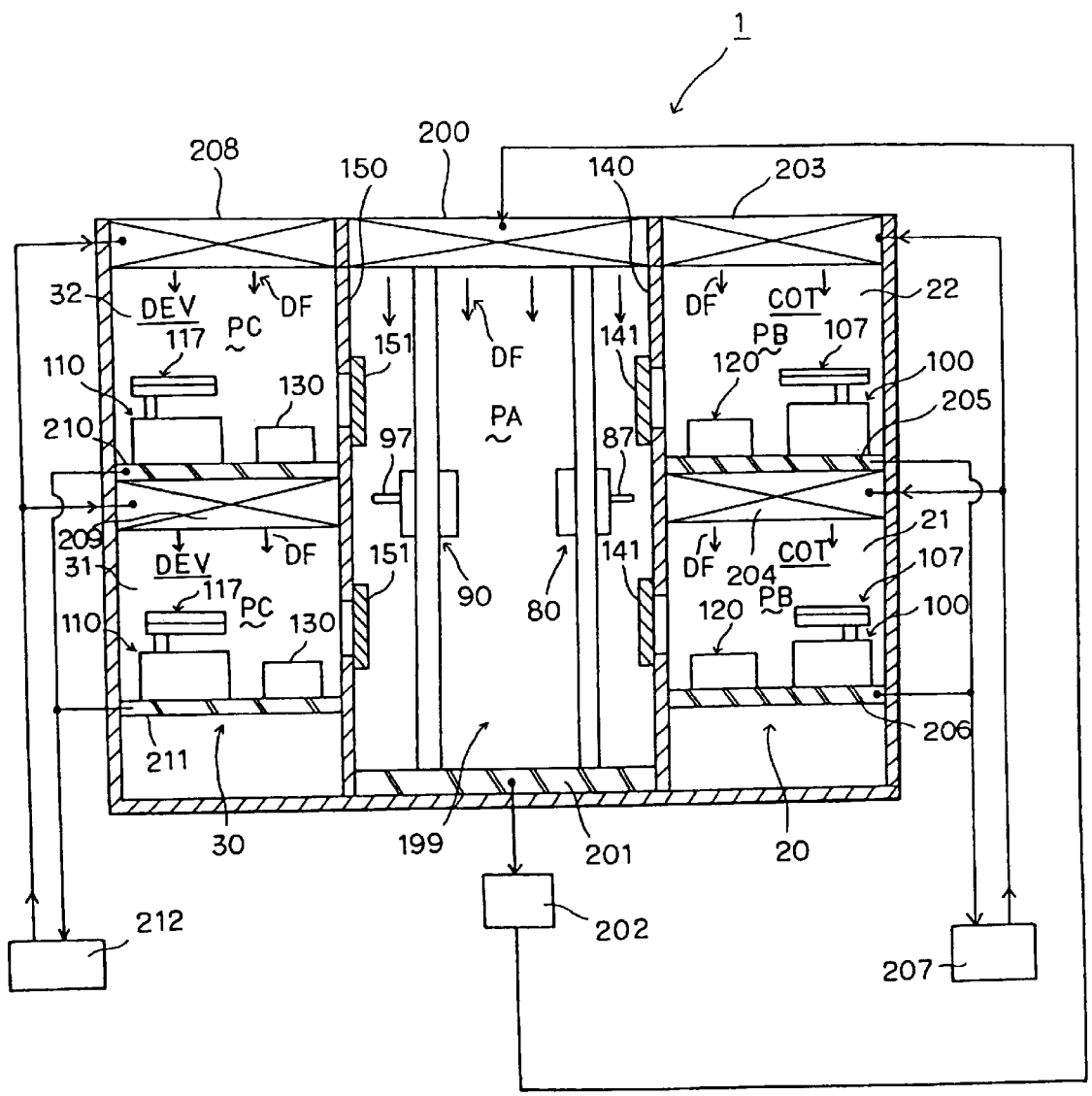
F I G. 9

SUBSTRATE PROCESSING APPARATUS

BACKGROUND OF THE INVENTION

1. Field of the Invention

The present invention relates to a substrate processing apparatus.

2. Description of the Related Art

In a photo resist process of a semiconductor device fabrication, resist solution is coated on a substrate (for example, a semiconductor wafer—hereinafter referred to as wafer) and a resist film is formed thereon. The resist film is exposed with a particular pattern. The resultant wafer is developed with a developing solution. In a sequence of such steps, a coating/developing apparatus has been used.

The coating/developing apparatus has various liquid process units and various heat treatment units. The liquid process units are for example a resist coating unit (that coats a resist solution to a wafer and forms a resist film on the wafer) and a developing unit that develops a wafer that has been exposed. The heat treatment units are for example a heating unit (that heats a wafer coated with a resist film) and a cooling unit (that cools a wafer that has heated). The liquid process units and the heat treatment units are piled up so that the installation space in the coating/developing apparatus is reduced. A wafer is conveyed to each liquid process unit and each heat treatment unit by conveying units. In other words, the coating/developing apparatus, the liquid process units, heat treatment units, and conveying units are integrally disposed in the coating/developing apparatus.

However, as the diameters of wafers becomes large, the sizes of heat treatment units and liquid process units are increased. Thus, since heat treatment units and liquid process units are more integrally disposed in a coating/developing apparatus, heat generated by heating units tends to adversely affect liquid process units. In addition, as the sizes of heating units as heat sources increase, the amount of heat generated by the heating units also increases. Consequently, the liquid process units are adversely affected by heat. For example, the film thickness of a resist film formed by a resist coating unit will vary.

SUMMARY OF THE INVENTION

The present invention is made from the above-described point of view. An object of the present invention is to provide a process apparatus that suppresses variation of the film thickness of process solution against heat generated by a heating unit that heats a substrate such as wafer with a large diameter.

An aspect of the present invention is a substrate processing apparatus, comprising a liquid process block having a liquid process unit for supplying a process solution to a substrate and processing the substrate with the process solution, and a cooling unit for cooling the substrate to a predetermined temperature, a heating unit for heating the substrate to a predetermined temperature, a main conveying unit for conveying the substrate between the heating unit and the cooling unit of the liquid process block, and a sub-conveying unit, disposed in the liquid process block, for conveying the substrate between the liquid process unit of the liquid process block and the cooling unit, wherein a heat insulating member that surrounds at least a portion opposite to the heating unit.

Thus, since a heat insulating member that surrounds a portion facing a heating unit is provided, heat generated by the heating unit is not radiated to a liquid process block. Thus, since the liquid process unit is not affected by heat, the liquid process unit can form a film (such as a resist film) of process solution with a predetermined thickness. In addition, since the liquid process block has a cooling unit, temperature rise of the atmosphere in the liquid process block can be suppressed. Thus, the liquid process block can be properly operated. In the liquid process block, a substrate is conveyed by a sub-conveying unit that does not convey a hot substrate. Consequently, in the liquid process block, a substrate can be conveyed in a state in which the film thickness of a film coated on the substrate does not vary. Thus, variation of the film thickness of a film of process solution (such as resist solution) can be securely prevented.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 7 is a schematic diagram for explaining a resist coating block of the coating/developing apparatus shown in FIG. 1;

FIG. 8 is a schematic diagram for explaining the structure of a developing block of the coating/developing apparatus shown in FIG. 1; and FIG. 9 is a schematic diagram for explaining the atmosphere in the coating/developing apparatus shown in FIG. 1.

DESCRIPTION OF PREFERRED EMBODIMENT

Figure 1:
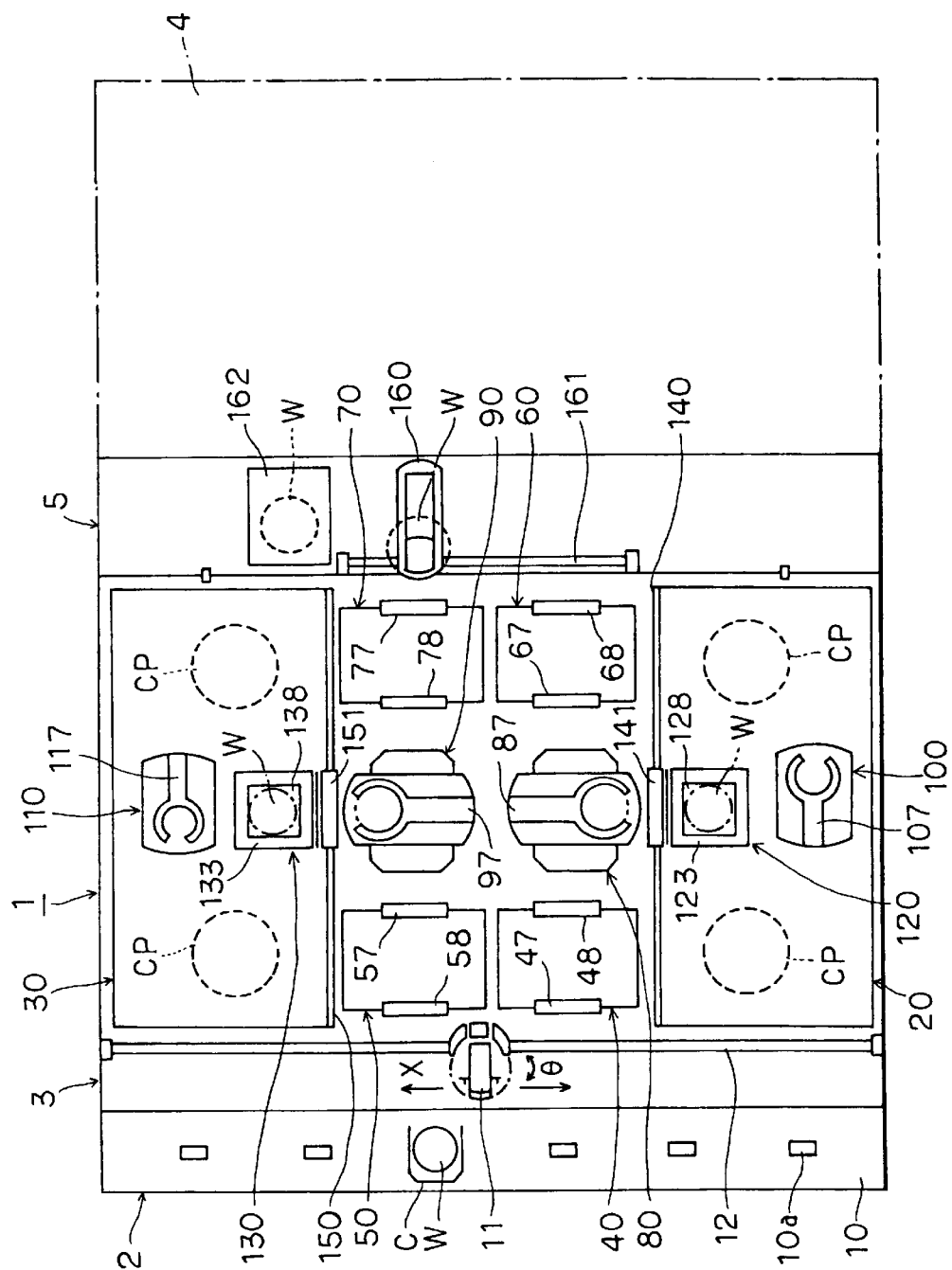
FIG. 1 is a plan view showing the structure of a coating/developing apparatus according to an embodiment of the present invention.
Figure 2:
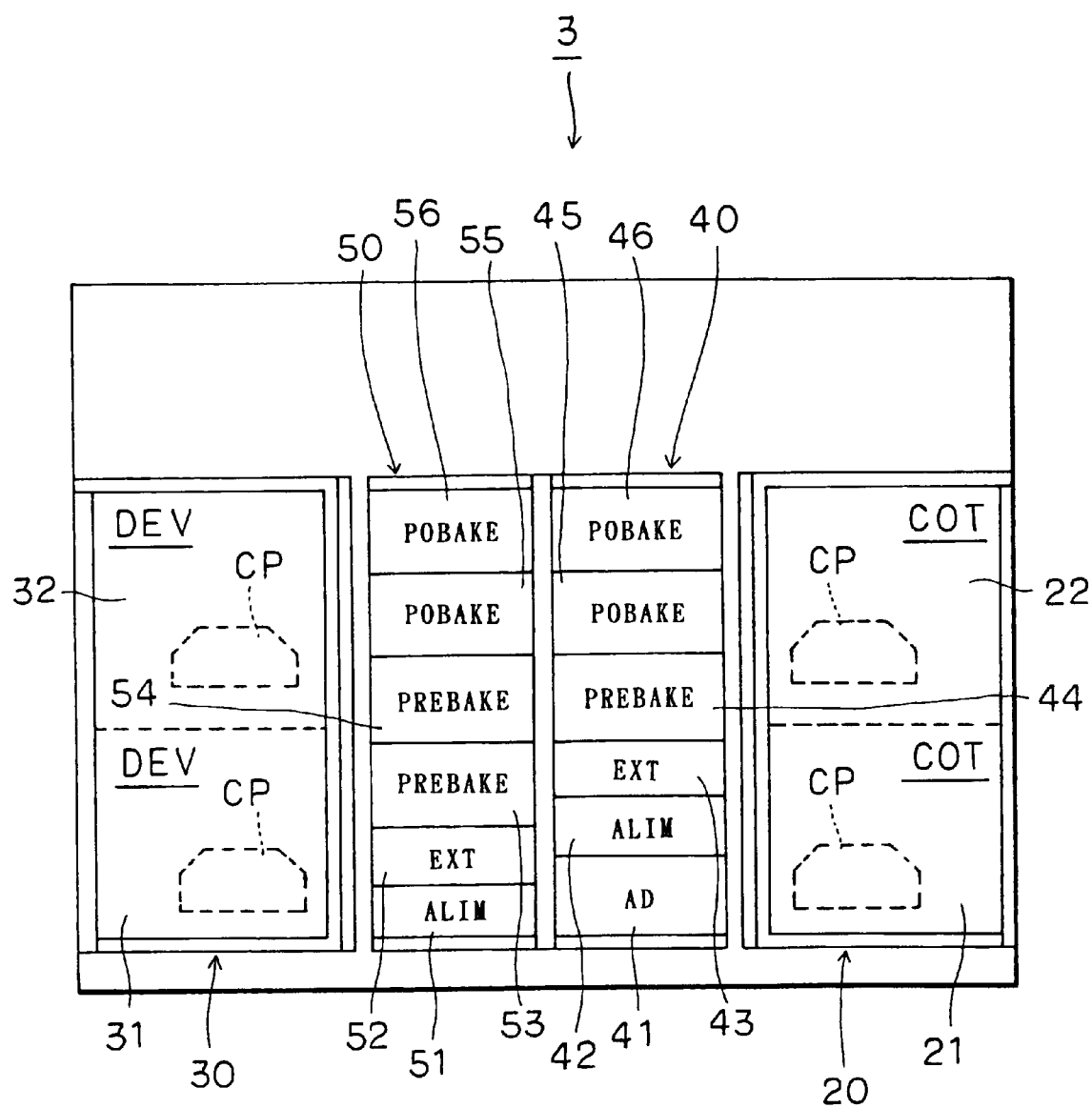
FIG. 2 is a side view showing the structure of the coating/developing apparatus shown in FIG. 1, viewed from a cassette station.
Figure 3:
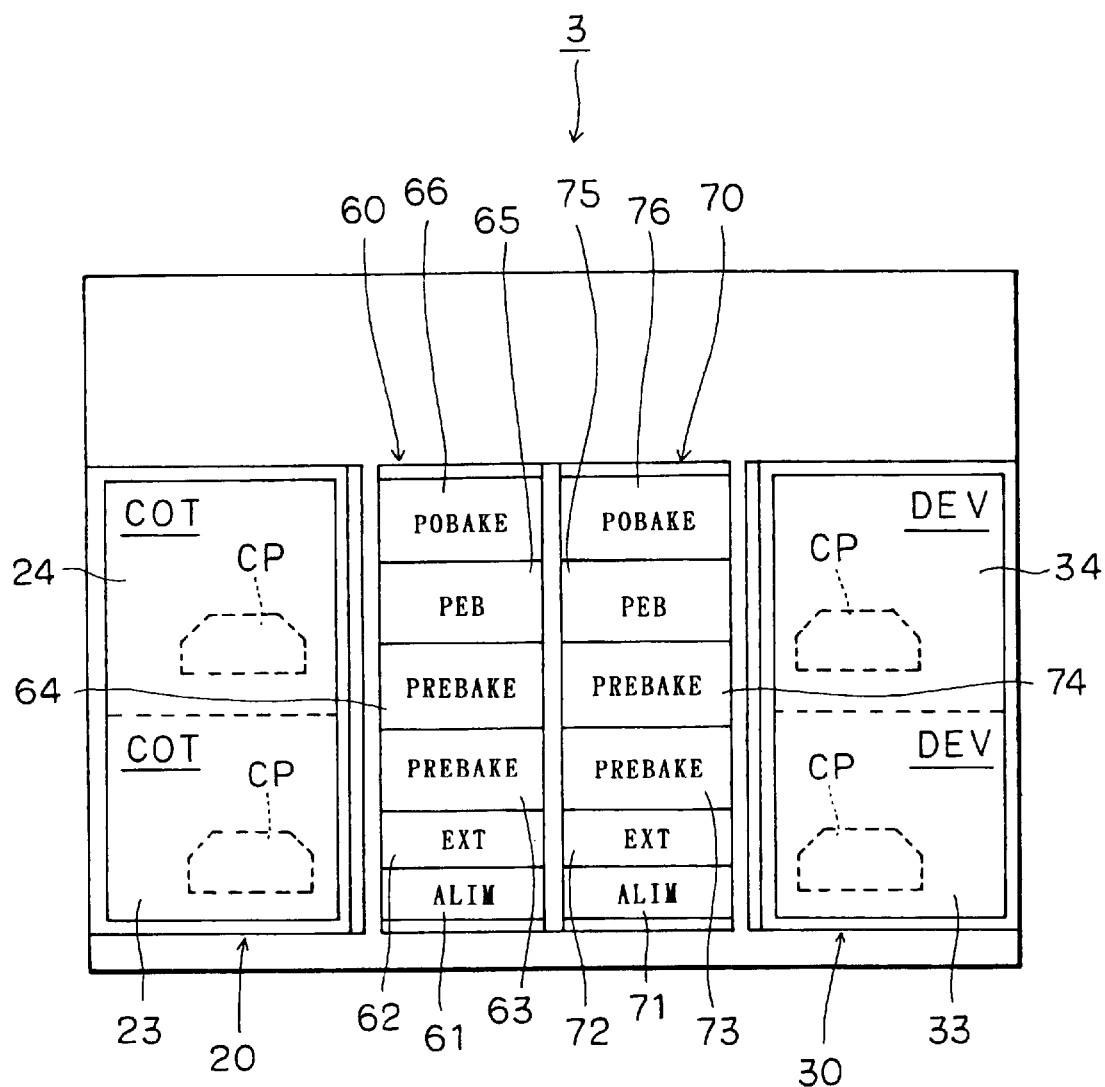
FIG. 3 is a side view showing the structure of the coating/developing apparatus shown in FIG. 1, viewed from an interface portion.

With reference to the accompanying drawings, an embodiment of the present invention will be described. FIGS. 1 to 3 show appearances of a coating/developing apparatus according to the embodiment of the present invention. FIG. 1 is a plan view showing the structure of the coating/developing apparatus. FIGS. 2 and 3 are side views of FIG. 1.

As shown in FIG. 1, the coating/developing apparatus 1 has a cassette station 2, a process station 3, and an interface portion 5 that are integrally connected. The cassette station 2 holds cassettes C that are conveyed from the outside of the apparatus. Each of the cassettes C accommodates a plurality of substrates (for example, 25 substrates (wafers)). In addition, on the cassette station 2, a wafer W is loaded and unloaded to/from a cassette C. The process station 3 has various component-type process units that perform respective processes for a wafer W. The interface portion 5 transfers a wafer W with an exposing unit 4 disposed adjacent to the coating/developing apparatus 1.

On the cassette station 2, a plurality of cassettes C are aligned in the X direction of FIG. 1 at alignment protrusions 10a on a cassette table 10 in such a manner that respective wafer loading/unloading openings of the cassettes C face the process station 3. A wafer conveying member 11 as a loading/unloading mechanism can be traveled along a conveying path 12. The wafer conveying member 11 can also be traveled in the arrangement direction (X direction) of the cassettes C and in the arrangement direction (Z direction) of wafers W accommodated in each cassette C. Thus, the wafer conveying member 11 can selectively gain access to each cassette C. The wafer conveying member 11 can also be rotated in the direction θ of FIG. 1. Thus, the wafer conveying member 11 can access an alignment unit 42 of a first heat treatment block 40 and an extension unit 52 of a second heat treatment block 50 of the process station 3.

The process station 3 has a resist coating block 20 (on the lower side of FIG. 1) and a developing block 30 (on the upper side of FIG. 1). FIG. 2 is a sectional view showing the structure of the process station 3 viewed from the cassette station 2. With reference to FIG. 2, the resist coating block 20 and the developing block 30 will be described. The resist coating block 20 has two resist coating units 21 and 22 that are piled up as a lower unit and an upper unit. Each of the resist coating units 21 and 22 coats resist solution to a wafer W placed in a cup CP and forms a resist film with a predetermined thickness on the wafer W. The developing block 30 has two developing units 31 and 32 that are piled up as a lower unit and an upper unit. Each of the developing units 31 and 32 supplies developing solution to a wafer W placed in a cup CP and performs a predetermined developing process for the wafer W with the developing solution.

FIG. 3 is a sectional view showing the structure of the process station 3 viewed from the interface portion 5. With reference to FIG. 3, the resist coating block 20 and the developing block 30 will be described. The resist coating block has two resist coating units 23 and 24 that are piled up as a lower unit and an upper unit. The structures of the resist coating units 23 and 24 are the same as those of the resist coating units 11 and 22. The developing block 30 has two developing units 33 and 34 that are piled up as a lower unit and an upper unit. The structures of the developing units 33 and 34 are the same as those of the developing units 31 and 32. Thus, the resist coating block 20 has a total of four resist coating units 21, 22, 23, and 24. The developing block 30 has a total of four developing units 31, 32, 33, and 34.

Four heat treatment blocks each of which is composed of various heating units that heat a wafer W at a predetermined temperature are disposed between the resist coating block 20 and the developing block 30. The four heat treatment blocks are a first heat treatment block 40, a second heat treatment block 50, a third heat treatment block 60, and a fourth heat treatment block 70. The first heat treatment block 40 and the second heat treatment block 50 are disposed opposite to the cassette station 2. The third heat treatment unit 60 and the fourth heat treatment block 70 are disposed opposite to the interface portion 5.

The first heat treatment block 40 has for example an adhesion unit 41, an alignment unit 42, an extension unit 43, two pre-baking units 44 and 45, and a post-baking unit 46 that are successively piled up as six units. The adhesion unit 41 improves adhesion of a resist film to a wafer W. The alignment unit 42 aligns a wafer W. The extension unit 43 temporarily holds a wafer W. Each of the pre-baking units 44 and 45 heats a wafer W coated with resist solution. The post-baking unit 46 heats a wafer W that has been developed. The second heat treatment block 50 has for example an alignment unit 51, an extension unit 52, two pre-baking units 53 and 54, and two post-baking units 55 and 56 that are successively piled up as six units.

Each heating unit of the first heat treatment block 40 has a wafer loading opening 47 and a wafer unloading opening 48. Likewise, each heating unit of the second heat treatment block 50 has a wafer loading opening 57 and a wafer unloading opening 58.

The third heat treatment block 60 has for example an alignment unit 61, an extension unit 62, two pre-baking units 63 and 64, a post-exposure baking unit 65, and a post-baking unit 66 that are successively piled up as six units. The post-exposure baking unit 65 heats a wafer W that has been exposed at a predetermined temperature. The fourth heat treatment block 70 has for example an alignment unit 71, an extension unit 72, two pre-baking units 73 and 74, a post-exposure baking unit 75, and a post-baking unit 76 that are successively piled up as six units. Each heating unit of the third heat treatment block 60 has a wafer loading opening 67 and a wafer unloading opening 68. Each heating unit of the fourth heat treatment block 70 has a wafer loading opening 77 and a wafer unloading opening 78.

Figure 4:
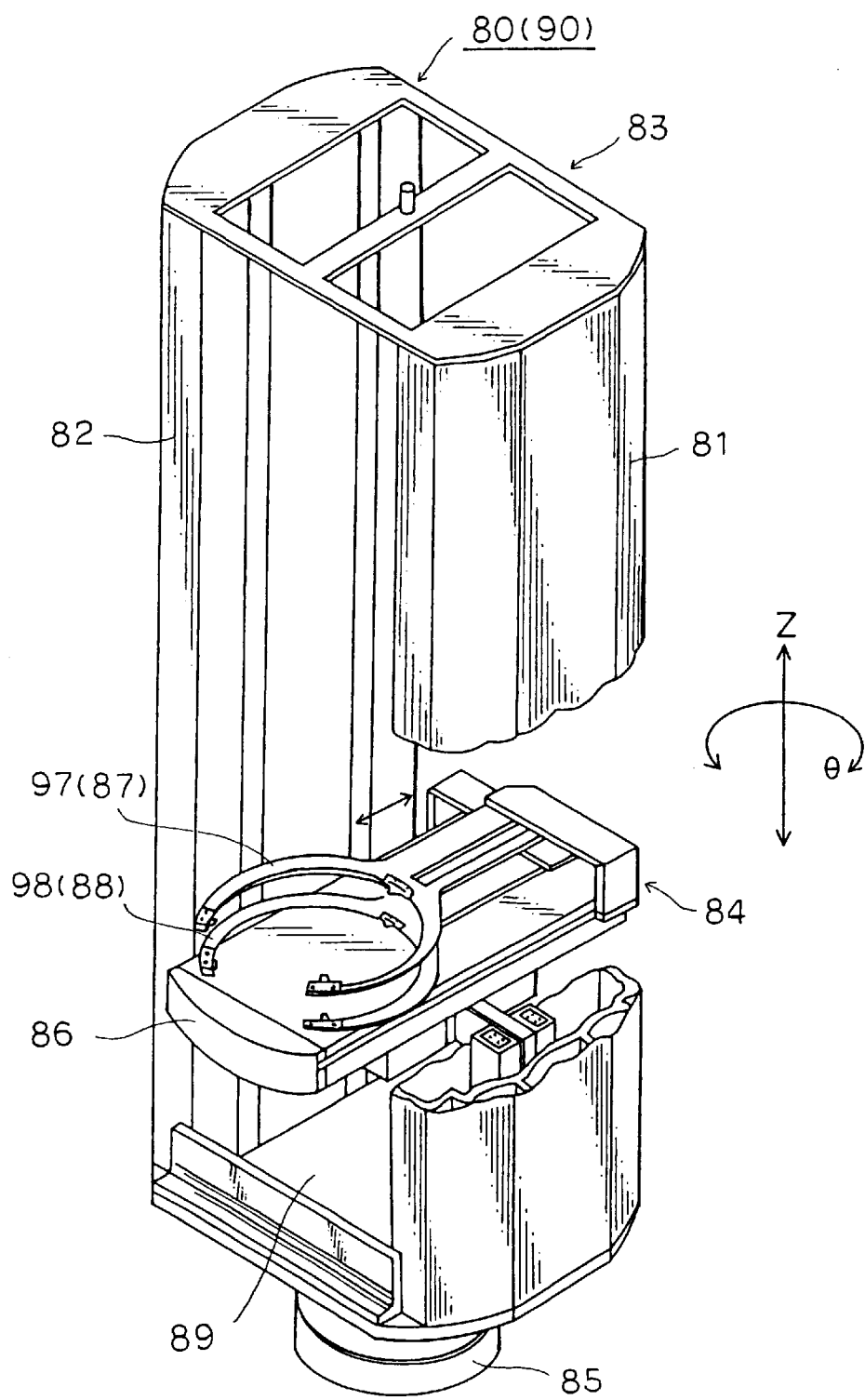
FIG. 4 is a perspective view showing the structure of a first main conveying unit of the coating/developing apparatus shown in FIG. 1.

A first main conveying unit 80 is disposed between the first heat treatment block 40 and the third heat treatment block 60. A second main conveying unit 90 is disposed between the second heat treatment block 50 and the fourth heat treatment block 70. The structure of the first main conveying unit 80 is basically the same as the structure of the second main conveying unit 90. Next, with reference to FIG. 4, the structure of the first main conveying unit 80 will be described. The first main conveying unit 80 has a wafer conveying means 84 disposed in a cylindrical support member 83 composed of a pair of wall portions 81 and 82. The wall portions 81 and 82 are oppositely disposed. The upper edges of the wall portions 81 and 82 are connected with each other. Likewise, the lower edges of the wall portions 81 and 82 are connected with each other. The wafer conveying means 84 can travel vertically (in the Z direction of FIG. 4). The cylindrical support member 83 is connected to a rotating shaft of a motor 85. With the rotating drive force of the motor 85, the cylindrical support member 83 is rotated around the rotating shaft together with the wafer conveying means 84. Thus, the wafer conveying means 84 can be rotated in the θ direction.

Two pincettes 87 and 88 that hold a wafer W are disposed as upper and lower pincettes on a conveying pedestal 86 of the wafer conveying means 84. The structure of the pincette 87 is basically the same as the structure of the pincette 88. The pincettes 87 and 88 have a shape and a size of which they can pass through a side opening portion 89 formed between the wall portions 81 and 82. The pincettes 87 and 88 can be moved forwardly and backwardly by respective motors (not shown) disposed in the conveying pedestal 86. As with the first main conveying unit 80, the second main conveying unit 90 has pincettes 97 and 98 as an upper pincette and a lower pincette.

Figure 5:
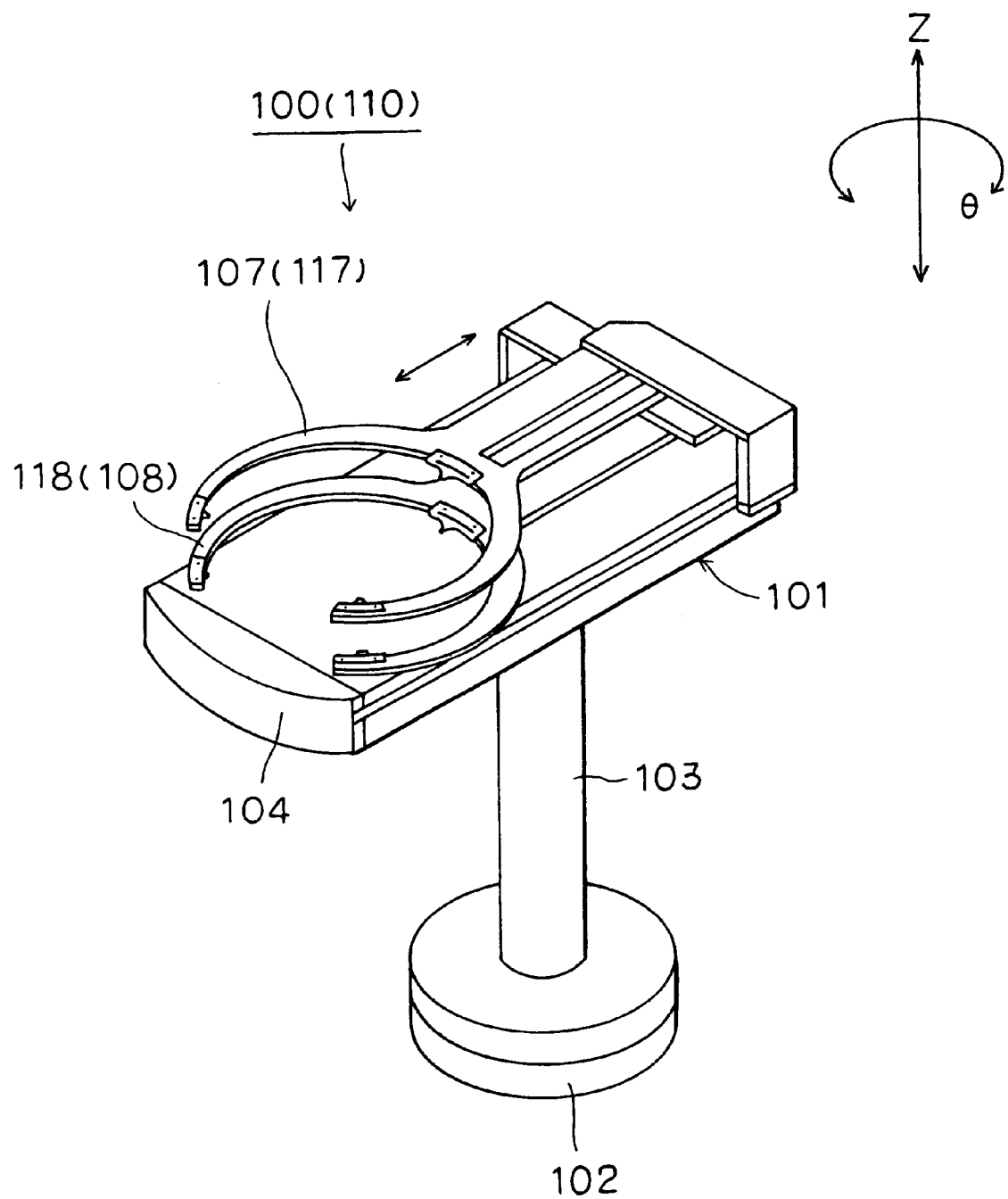
FIG. 5 is a perspective view showing the structure of a first sub-conveying unit of the coating/developing apparatus shown in FIG. 1.

A first sub-conveying unit 100 is disposed in the resist coating block 20. A second sub-conveying unit 110 is disposed in the developing block 30. The structure of the first sub-conveying unit 100 is basically the same as the structure of the second sub-conveying unit 110. Next, with reference to FIG. 5, the structure of the first sub-conveying unit 100 will be described. The first sub-conveying unit 100 has a wafer conveying means 101. The wafer conveying means 101 can be vertically moved (in the Z direction of FIG. 5). The wafer conveying means 101 is supported by a rotating shaft 103 rotated by rotating drive force of a motor 102. The wafer conveying means 101 can be rotated in the θ direction of FIG. 5. Two pincettes 107 and 108 that hold a wafer W are disposed as an upper pincette and a lower pincette on a conveying substrate 104 of the wafer conveying means 101. The structure of the pincette 107 is basically the same as the structure of the pincette 108. The pincettes 107 and 108 can be moved forwardly and backwardly by respective motors (not shown) disposed in the conveying pedestal 104. Likewise, the second sub-conveying unit 110 has two pincettes 117 and 118 as an upper pincette and a lower pincette. The structures of the pincettes 117 and 118 are basically the same as the structures of the pincettes 107 and 108.

Figure 6:
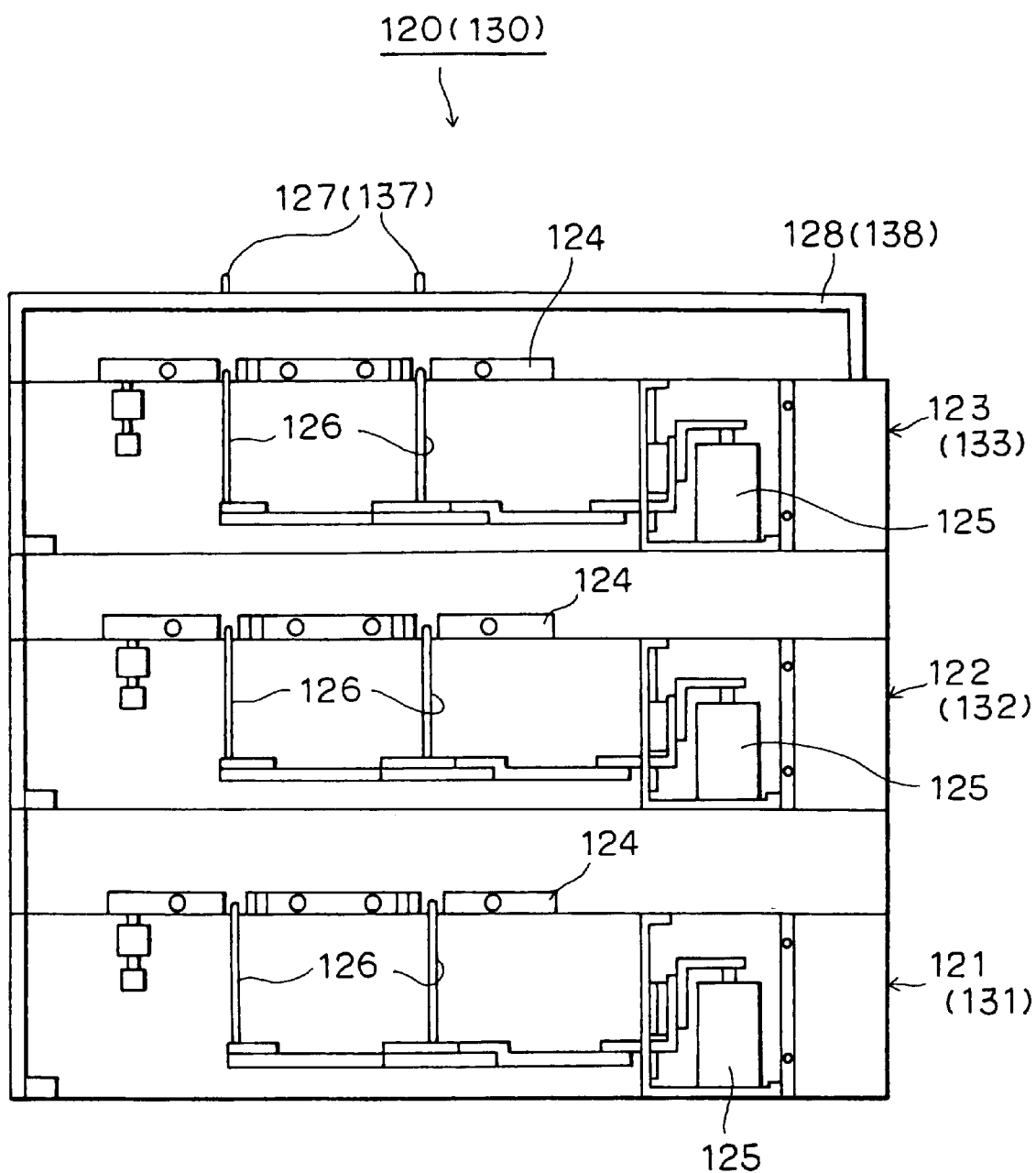
FIG. 6 is a schematic diagram for explaining a cooling unit group of the coating/developing apparatus shown in FIG. 1.

The resist coating block 20 has a cooling unit group 120. The developing block has a cooling unit group 130. The structure of the cooling unit group 120 is basically the same as the structure of the cooling unit group 130. Next, with reference to FIG. 6, the structure of the cooling unit group 120 will be described. The cooling unit group 120 has three cooling units 121, 122, and 123 that are successively piled up. Each of the cooling units 121, 122, and 123 has a cooling table 124 and a plurality of lift pins 126. For example, the number of lift pins 126 is three. The cooling table 124 has a circulation path (not shown) that circulates water at constant temperature (for example, 23°C.). The lift pins 126 are lifted up and down through holes formed in the cooling table 124 by a cylinder 125. Thus, when a wafer W held by the lift pins 126 is placed on the cooling table 124, the wafer W is cooled.

A wafer table 128 is disposed above the upper cooling unit 123. The wafer table 128 holds a wafer W with hold pins 127. As with the resist coating block 20, the developing block 30 has three cooling units 131, 132, and 133 that are successively piled up. A wafer table 138 is disposed above the upper cooling unit 133. The wafer table 138 has hold pins 137.

In the resist coating block 20, the resist coating units 21 and 22 and the resist coating units 23 and 24 are disposed as shown in FIG. 7. The first sub-conveying unit 100 and the cooling unit group 120 are disposed between the resist coating units 21 and 22 and the resist coating units 23 and 24. In the developing block 30, the developing units 31 and 32 and the developing units 33 and 34 are disposed as shown in FIG. 8. The second sub-conveying unit 110 and the cooling unit group 130 are disposed between the developing units 31 and 32 and the developing units 33 and 34. In such an arrangement, the units of the resist coating block 20 and the developing block 30 can be integrally provided.

In the resist coating block 20, a heat insulating panel 140 is disposed opposite to the first heat treatment block 40 and the third heat treatment block 60. The heat insulating panel 140 insulates heat generated by the heat treatment blocks 40, 50, 60, and 70. In the developing block 30, a heat insulating panel 150 is disposed opposite to the second heat treatment block 50 and the fourth heat treatment block 70. The heat insulating panel 140 has a wafer loading/unloading opening 141 that allows the pincette 87 and 87 of the first main conveying unit 80 to pass a wafer W. The heat insulating panel 150 has a wafer loading/unloading opening 151 through which the pincettes 97 and 98 of the second main conveying unit 90 and a wafer W held thereby are allowed to pass.

The first main conveying unit 80 conveys a wafer W among heating units of the first heat treatment block 40 and the third heat treatment block 60, the cooling units 121, 122, and 123 of the resist coating block 20, and the wafer table 128. The second main conveying unit 90 conveys a wafer W among the heating units of the second heat treatment block 50 and the fourth heat treatment block 70, the cooling units 131, 132, and 133 of the developing block 30, and the wafer table 138. The first sub-conveying unit 100 conveys a wafer W among the resist coating units 21, 22, 23, and 24, the cooling units 121, 122, and 123, and the wafer table 128. The second sub-conveying unit 110 conveys a wafer W among the developing units 31, 32, 33, and 34, the cooling units 131, 132, and 133, and the wafer table 138. As described above, the resist coating block 20, the developing block 30, the heat treatment blocks 40, 50, 60, and 70, and the main conveying units 80 and 90 are integrally disposed in the process station 3.

The interface portion 5 has a wafer conveying member 160 that conveys a wafer W. The wafer conveying member 160 can be moved in the X direction along a conveying rail 161, the Z direction (vertical direction), and the θ direction of FIG. 1. The wafer conveying member 160 conveys a wafer W among the exposing unit 4, the extension unit 62 of the third heat treatment block 60, the extension unit 72 of the fourth heat treatment block 70, and a periphery exposing unit 162. The periphery exposing unit 162 exposes the peripheral portion of a wafer W.

FIG. 9 is a sectional view showing the structure of the coating/developing apparatus 1. Referring to FIG. 9, a filter 200 is disposed at a ceiling portion of a main conveying region 199 in which the first main conveying unit 80 and the second main conveying unit 90 are disposed. The filter 200 forms a down-flow DF and removes particles and so forth. An exhaust mechanism 201 that exhausts and gathers the down-flow DF of the filter 200 is disposed at a lower position of the main conveying region 199. The exhaust mechanism 201 is connected to a temperature/humidity adjusting mechanism 202. The temperature/humidity adjusting mechanism 202 sets the temperature and/or humidity of the down-flow DF exhausted and gathered by the exhaust mechanism 201 to desired levels and supplies the set levels to the filter 200.

By adjusting the air blow amount of the filter 200 and the amount of exhaust air of the exhaust mechanism 201, the pressure of the main conveying region 199 is set to a desired pressure PA.

Filters 203 and 204 are disposed at ceiling portions of coating regions in which the resist coating units 21 and 22, the first sub-conveying unit 100, and the cooling unit group 120 are disposed. The filters 203 and 204 form respective down-flows DF and remove particles and so forth. At lower positions of the resist coating regions, exhaust mechanisms 205 and 206 that exhaust and gather down-flows DF of the filters 203 and 204 are disposed, respectively. The exhaust mechanisms 205 and 206 are connected to a temperature/humidity adjusting mechanism 207. The temperature/humidity adjusting mechanism 207 sets the temperature and/or humidity of the down-flows DF exhausted and gathered by the exhaust mechanisms 205 and 206 to desired levels and supplies the set levels to the filters 203 and 204.

By adjusting the air blow amounts of the filters 203 and 204 and the air exhaust amounts of the exhaust mechanisms 205 and 206, the pressure of the coating regions is set to a desired pressure PB.

Filters 208 and 209 are disposed at ceiling portions of developing regions in which the developing units 31 and 32, the second sub-conveying unit 110, and the cooling unit group 130 are disposed. The filters 208 and 209 form down-flows DF and remove particles and so forth. Exhaust mechanisms 210 and 211 are disposed at lower positions of the developing regions, respectively. The exhaust mechanisms 210 and 211 exhaust and gather down-flows DF of the filters 208 and 209, respectively. The exhaust mechanisms 210 and 211 are connected to a temperature/humidity adjusting mechanism 212. The temperature/humidity adjusting mechanism 212 sets the temperature and/or humidity of the down-flows DF exhausted and gathered by the exhaust mechanisms 210 and 220 to desired levels and supplies the set levels to the filters 208 and 209.

By adjusting the air blow amounts of the filters 208 and 209 and the air exhaust amounts of the exhaust mechanisms 210 and 211, the pressure of the developing regions can be set to a desired pressure PC.

It is preferred that the inner pressures of the main conveying region, coating regions, and developing regions are higher than the inner pressure of a clean room. Thus, particles or organic substances such as alkali components (for example, amine) can be prevented from entering the coating/developing apparatus 1. Consequently, the process of substrates can be suppressed from being adversely affected by particles and organic substances.

Next, the relation of inner pressures of the main conveying region, the coating regions, and the developing regions will be described. It is preferred that each of the pressure PB of the coating regions and the pressure PC of the developing regions is higher than the pressure PA of the main conveying region. Thus, particles or organic substances such as alkali components (for example, amine) of the main conveying region can be prevented from entering the coating regions and the developing regions of the process regions of the liquid process block. Consequently, the process of substrates can be suppressed from being adversely affected by particles or organic substances.

The filters 208 and 209 of the developing regions are the most adversely affected by organic substances such as alkali components (for example, amine). Thus, it is preferred that each of the filters 208 and 209 has a chemical component removing mechanism. The individual regions should have individual atmospheres.

The coating/developing apparatus 1 according to the embodiment of the present invention is structured as described above. In the cassette station 2, the wafer conveying member 11 accesses a cassette C and unloads a raw wafer W therefrom. The wafer conveying member 11 enters the first heat treatment block 40 through the wafer loading opening 47 and loads the wafer W to the alignment unit 42 of the first heat treatment block 40. The alignment unit 42 aligns the wafer W. The first main conveying unit 80 enters the alignment unit 42 through the wafer unloading opening 48, holds the wafer W with the pincette 88, and loads the wafer W to the adhesion unit 41 of the first heat treatment block 40.

After the adhesion unit 41 has performed the adhesion process for the wafer W, the first main conveying unit 80 holds the wafer W with the pincette 87, conveys the wafer W to the cooling unit group 120 through the wafer loading/unloading opening 141, and loads the wafer W to the cooling unit 121. After the cooling unit 121 has performed the cooling process for the wafer W, the first sub-conveying unit 100 holds the wafer W with the pincette 108 and loads the wafer W to, for example, the resist coating unit 21 of the resist coating block 20. After the resist coating unit 21 has coated the predetermined resist on the wafer W, the first sub-conveying unit 100 holds the wafer W with the pincette 107 and conveys the wafer W to the cooling unit group 120. In the cooling unit group 120, the first sub-conveying unit 100 places the wafer W on the hold pins 127 of the wafer table 128.

The first main conveying unit 80 holds the wafer F with the pincette 88 and conveys the wafer W from the wafer table 128 to the third heat treatment block 60. The first main conveying unit 80 loads the wafer W to the pre-baking unit 63 of the third heat treatment block 60 with the pincette 88. The pre-baking unit 63 performs a heating process for the wafer W. This heating process is performed after the resist coating process is performed before the exposing process is performed. After the pre-baking process 63 has performed the heating process for the wafer W, the first main conveying unit 80 loads the wafer W to the extension unit 62 of the third heat treatment block 60. The wafer W is temporarily held in the extension unit 62. The wafer conveying member 160 enters the extension unit 62 through the wafer unloading opening 68 and conveys the wafer W from the extension unit 62 to the periphery exposing unit 162. After the periphery exposing unit 162 has removed an unnecessary resist film from the periphery of the wafer W, the wafer conveying member 160 conveys the wafer W to the exposing unit 4. The exposing unit 4 performs the predetermined exposing process for the wafer W.

After the exposing unit 4 has performed the exposing process for the wafer W, the wafer conveying member 160 conveys the wafer W to the extension unit 72 of the fourth heat treatment block 70 through the wafer loading opening 77. The second main conveying unit 90 unloads the wafer W from the extension unit 72 with the pincette 98 and loads the wafer W to the post-exposure baking unit 75 of the fourth heat treatment block 70. The post-exposure baking unit 75 performs a heating process for the wafer W. This heating process is performed after the exposing process is performed.

After the post-exposure baking unit 75 has performed the heating process for the wafer W, the second main conveying unit 90 unloads the wafer W from the post-exposure baking unit 75 with the pincette 98, conveys the wafer W to the cooling unit group 130 of the developing block 30 through the wafer loading/unloading opening 151, and loads the wafer W to the cooling unit 131 with the pincette 98. After the cooling unit 131 has performed the cooling process for the wafer W, the second sub-conveying unit 110 unloads the wafer W from the cooling unit 131 with the pincette 118 and loads the wafer W to the developing unit 31 with the pincette 118. After the developing unit 31 has performed the developing process for the wafer W, the second sub-conveying unit 110 unloads the wafer W from the developing unit 31 with the pincette 117 and places the wafer W on the hold pins 137 of the wafer table 138.

The second main conveying unit 90 holds the wafer W on the hold pins 137 of the wafer table 138 with the pincette 98, conveys the wafer W to the post-baking unit 55 of the second heat treatment block 50 through the wafer loading/unloading opening 151, and loads the wafer W to the post-baking unit 55 with the pincette 98. After the post-baking unit 55 has performed the heating process for the wafer W, the second main conveying unit 90 unloads the wafer W from the post-baking unit 55 with the pincette 98 and loads the wafer W to the extension unit 52 with the pincette 98. The wafer W is temporarily held in the extension unit 52.

The wafer conveying member 11 enters the extension unit 52 through the wafer loading opening 58, unloads the wafer W from the extension unit 52, and loads the wafer W to a predetermined cassette C on the cassette table 10. Thus, a sequence of coating/developing steps is completed.

In the coating/developing apparatus 1 according to the embodiment of the present invention, the heat insulating panel 140 disposed to the resist coating block 20 insulates the resist coating units 21, 22, 23, and 24 of the resist coating block 20 from heat generated by the heating units of the heat treatment blocks 40, 50, 60, and 70. In addition, the heat insulating panel 150 disposed to the developing block 30 insulates the developing units 31, 32, 33, and 34 of the developing block 30 against heat generated by the heating units of the heat treatment blocks 40, 50, 60, and 70. Thus, even if heating units become large and the amount of heat generated therefrom increases, liquid processes—resist coating process and developing process can be performed at proper temperatures. Thus, variation of the film thickness of a resist film coated on a wafer W can be prevented.

In addition, since the resist coating block 20 has the cooling units 121, 122, and 123, temperature rise in the resist coating block 20 can be suppressed. Thus, the resist coating units 21, 22, 23, and 24 can perform the resist coating process for wafers W at a proper temperature. Likewise, since the developing block 30 has the cooling units 131, 132, and 133, temperature rise in the developing block 30 can be prevented. Thus, as with the resist coating block 20, the developing units 31, 32, 33, and 34 can perform the developing process for wafers at a proper temperature.

In the resist coating block 20, the first sub-conveying unit 100 conveys a wafer W. Since the first sub-conveying unit 100 does not convey a hot wafer W, the pincettes 107 and 108 of the first sub-conveying unit 100 are not heated. Thus, the pincettes 107 and 108 do not adversely affect a resist film coated on a wafer W. Consequently, in the resist coating block 20, a wafer W can be conveyed in such a manner that the film thickness of a resist film coated on the wafer W does not vary.

Since the resist coating units 21, 22, 23, and 24, the first sub-conveying unit 100, and the cooling units 121, 122, and 123 are integrally disposed in the resist coating block 20, the conveying path of the first sub-conveying unit 100 for a wafer W becomes short. Thus, the first sub-conveying unit 100 can quickly convey a wafer W in the resist coating block 20. Likewise, in the developing block 30, the conveying path of the second sub-conveying unit 110 for a wafer W becomes short. Thus, the second sub-conveying unit 100 can quickly convey a wafer W. Consequently, the number of wafers W processed per predetermined time period by the apparatus increases.

The resist coating block 20, the developing block 30, and the heat treatment blocks 40, 50, 60, and 70 are integrally disposed in the process station 3. Various units are integrally disposed in the resist coating block 20 and the developing block 30. Thus, the overall size of the coating/developing apparatus 1 can be reduced.

Each heating unit of the heat treatment blocks 40, 50, 60, and 70 has a wafer loading opening and a wafer unloading opening. Thus, the main conveying units 80 and 90 can effectively load and unload wafers W.

In the embodiment of the present invention, the heat insulating panel 140 is disposed to the resist coating block 20 opposite to the first heat treatment block 40 and the third heat treatment block 60. However, according to the present invention, the heat insulating panel 140 may be disposed so as to surround the entire periphery of the resist coating block 20. Likewise, the heating insulating panel 150 may be disposed so as to surround the entire periphery of the developing block 30.

In addition, the cooling units 123 and 133 may be used as simple wafer tables. Substrates processed by the apparatus may be LCD substrates as well as wafers W.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A substrate processing apparatus, comprising:
   a liquid process block having:
   a liquid process unit that supplies a process solution to a substrate and process the substrate with the process solution, and
   a cooling unit that cools the substrate to a predetermined temperature;
   a heating unit that heats the substrate to a predetermined temperature;
   a main conveying unit that conveys the substrate between said heating unit and said cooling unit of said liquid process block;
   a sub-conveying unit, disposed in said liquid process block, that conveys the substrate between said liquid process unit of said liquid process block and said cooling unit; and
   a heat insulating panel that thermally isolates a portion of said liquid process unit, a adjacent to said heating unit, from said heating unit.

2. The substrate processing apparatus as set forth in claim 1,
   wherein the atmosphere in said liquid process block is different from an atmosphere of said main conveying unit.

3. The substrate processing apparatus as set forth in claim 1,
   wherein the pressure in said liquid process block is higher than the pressure of the atmosphere of said main conveying unit.

4. The substrate processing apparatus as set forth in claim 1,
   wherein said cooling unit is composed of a plurality of cooling units piled up in the vertical direction.

5. The substrate processing apparatus as set forth in claim 1,
   wherein each of said liquid process unit and said cooling unit of said liquid process block is composed of a plurality of units.

6. The substrate processing apparatus as set forth in claim 1,
   wherein said heating unit is composed of a plurality of units piled up in a vertical direction.

7. The substrate processing apparatus as set forth in claim 6, further comprising:
   a cassette station that holds a plurality of cassettes, each of the cassettes accommodating a plurality of substrates; and
   a loading/unloading mechanism that loads or unloads a substrate to/from a cassette.

8. The substrate processing apparatus as set forth in claim 7, wherein said loading/unloading mechanism conveys a substrate unloaded from a cassette to said heating unit.

9. A substrate processing unit, comprising:
a first liquid process block having:
  a liquid process unit that supplies a process solution to a substrate and processes the substrate with the process solution,
  a cooling unit that cools the substrate to a predetermined temperature, and
  a sub-conveying unit that conveys the substrate between said liquid process unit and said cooling unit;
a second liquid process block having:
  a liquid process unit, disposed opposite to said first liquid process block, that supplies process solution to the substrate and processes the substrate with the process solution;
  a cooling unit that cools the substrate to a predetermined temperature; and
  a sub-conveying unit that conveys the substrate between said process unit and said cooling unit;
a heating unit that heats the substrate to a predetermined temperature; and
a main conveying unit, disposed between said first liquid process block and said second liquid process block, that conveys the substrate at least between a cooling unit of said first liquid process block or said second liquid process block and the heating unit,
wherein heat insulating members that surround at least a portion opposite to said heating unit are disposed to said first liquid process block and said second liquid process block.

10. The substrate processing apparatus as set forth in claim 9,
wherein said heating unit is composed of at least two units disposed on both sides of said main conveying unit and between said first liquid process block and said second liquid process block.

11. The substrate processing apparatus as set forth in claim 9,
wherein the pressures in said first liquid process block and said second liquid process block are higher than the pressure of the atmosphere of said main conveying unit.

12. The substrate processing apparatus as set forth in claim 11,
wherein said cooling unit is composed of a plurality of cooling units piled up in the vertical direction.

13. The substrate processing apparatus as set forth in claim 12,
wherein said heating unit is composed of a plurality of units piled up in a vertical direction.

14. The substrate processing apparatus as set forth in claim 13, further comprising:
a cassette station that holds a plurality of cassettes, each of the cassettes accommodating plurality of substrates; and
a loading/unloading mechanism that loads or unloads at least one of the plurality of substrates to/from a cassette.

15. The substrate processing apparatus as set forth in claim 14,
wherein said loading/unloading mechanism conveys said at least of the plurality of substrates unloads from a cassette to said heating unit.

16. A substrate processing apparatus, comprising:
a first liquid process block and a second liquid process block, each of said first liquid process block and said second liquid process block has:
  two liquid process units that supply a process solution to a first substrate and process the first substrate with the process solution,
  a cooling unit that cools the first substrate solution to a predetermined temperature, and
  a sub-conveying unit that conveys the first substrate between said liquid process unit and said cooling unit; and
  a heating unit that heats the first substrate to a predetermined temperature, wherein two liquid process units are disposed on both sides of said cooling unit and said sub-conveying unit in each of said first liquid process block and said second liquid process block,
wherein said first liquid process block and said second liquid process block are oppositely disposed so that said cooling unit of said first liquid process block faces said cooling unit of said second liquid process block,
wherein a first main conveying unit that conveys the substrate between said cooling unit of said first process block and said heating unit and a second main conveying unit that conveys the substrate between said cooling unit of said second liquid process block and said heating unit are disposed between said first liquid process block and said second liquid process block, and
wherein heat insulating members that surround at least portions opposite to said heating unit are disposed to said first liquid process block and said second liquid process block.

17. The substrate processing apparatus as set forth in claim 16,
wherein said heating unit is composed of a plurality of units disposed on both sides of said first main conveying unit and said second main conveying unit and between said first liquid process block and said second liquid process block.

18. The substrate processing apparatus as set forth in claim 17,
wherein pressures in said first liquid process block and said second liquid process block are higher than the pressure of the atmosphere of said main conveying unit.

19. The substrate processing apparatus as set forth in claim 18, further comprising:
a cassette station that holds a plurality of cassettes, each of the cassettes accommodating a plurality of substrates; and
a loading/unloading mechanism that loads or unloads at least one of the plurality of substrates to/from at least one of said cassettes.

20. The substrate processing apparatus as set forth in claim 19,
wherein said loading/unloading mechanism conveys a substrate unloaded from said at least one cassette to said heating unit.

* * * * *